(12) United States Patent
Banyay et al.

(10) Patent No.: US 11,624,634 B2
(45) Date of Patent: Apr. 11, 2023

(54) ROTARY CONTROLLER

(71) Applicant: FORD GLOBAL TECHNOLOGIES, LLC, Dearborn, MI (US)

(72) Inventors: Matus Banyay, Frechen (DE); Martin Scheck, Pulheim (DE)

(73) Assignee: FORD GLOBAL TECHNOLOGIES, LLC, Dearborn, MI (US)

( * ) Notice: Subject to any disclaimer, the term of this patent is extended or adjusted under 35 U.S.C. 154(b) by 37 days.

(21) Appl. No.: 17/532,096

(22) Filed: Nov. 22, 2021

(65) Prior Publication Data

US 2022/0163352 A1 May 26, 2022

(30) Foreign Application Priority Data

Nov. 26, 2020 (DE) .......................... 102020214882.1

(51) Int. Cl.
*G01D 5/24* (2006.01)
*B60K 37/06* (2006.01)
*H03K 17/955* (2006.01)

(52) U.S. Cl.
CPC ............... *G01D 5/24* (2013.01); *B60K 37/06* (2013.01); *H03K 17/955* (2013.01); *G01D 2205/20* (2021.05)

(58) Field of Classification Search
CPC ........ G01R 27/00; G01R 27/02; G01R 27/26; G01R 27/2605; G01D 5/00; G01D 5/12; G01D 5/14; G01D 5/24; G01D 2205/00; G01D 2205/20; B60K 35/00; B60K 37/00; B60K 37/04; B60K 37/06; B60K 2370/00; B60K 2370/10; B60K 2370/12; B60K 2370/126; B60R 16/00; B60R 16/02; B60R 16/037; H03K 17/00; H03K 17/94; H03K 17/945; H03K 17/955; H03K 17/96; H03K 17/9622; H03K 2217/00; H03K 2217/94; H03K 2217/94057; H03K 2217/94073; H03K 2217/96062; H03K 2217/96066
USPC ................................ 324/600, 649, 658, 686
See application file for complete search history.

(56) References Cited

U.S. PATENT DOCUMENTS

| | | | | |
|---|---|---|---|---|
| 6,295,887 B1 * | 10/2001 | DeJonge | ................. | F16H 59/12 |
| | | | | 74/483 K |
| 8,359,943 B2 * | 1/2013 | Seki | ........................ | F16H 61/22 |
| | | | | 74/473.21 |
| 2009/0107287 A1 * | 4/2009 | Seki | ........................ | F16H 61/22 |
| | | | | 74/504 |

(Continued)

FOREIGN PATENT DOCUMENTS

| | | | | |
|---|---|---|---|---|
| DE | 102013222350 A1 | 5/2015 | | |
| DE | 102015203774 A1 * | 9/2015 | ............. | G06F 3/023 |

(Continued)

*Primary Examiner* — Hoai-An D. Nguyen
(74) *Attorney, Agent, or Firm* — Frank L. Lollo; MacMillan, Sobanski & Todd, LLC

(57) ABSTRACT

A rotary controller for a vehicle apparatus such as an infotainment system has at least two operating elements which are arranged at a spacing from one another in a direction of extent of an axis of rotation of the rotary controller. The rotary controller has a receptacle on which the operating elements are mounted along with a plurality of contact-sensitive sensor elements. Each sensor element associated with a respective operating element to detect a rotational movement about the axis of rotation when a user manually contacts the respective operating element.

19 Claims, 2 Drawing Sheets

(56) References Cited

U.S. PATENT DOCUMENTS

2015/0185757 A1* 7/2015 Jantke ................ G05G 9/04796
74/471 XY
2023/0038816 A1* 2/2023 Fribus ................... B60W 50/14

FOREIGN PATENT DOCUMENTS

| DE | 102020210052 A1 * | 2/2022 | ........... G06F 3/0362 |
| DE | 102021201184 A1 * | 8/2022 | ............. B60K 37/06 |
| KR | 20120008507 A * | 1/2012 | ........... G06F 3/0484 |

* cited by examiner

ROTARY CONTROLLER

CROSS REFERENCE TO RELATED APPLICATIONS

This application claims priority to application DE 102020214882.1, filed in the German Patent and Trademark Office on Nov. 26, 2020, which is incorporated herein by reference in its entirety.

STATEMENT REGARDING FEDERALLY SPONSORED RESEARCH

Not Applicable.

BACKGROUND OF THE INVENTION

The present invention relates in general to a rotary controller comprising an operating element which can be adjusted via rotation (i.e., a control dial or control knob). The invention may comprise an electric rotary controller such as a potentiometer.

Such a rotary controller is known from DE 102013222350A1. However, such a rotary controller only offers limited adjustment options. There is therefore a need to demonstrate ways in which improvements can be achieved in this regard.

SUMMARY OF THE INVENTION

According to one aspect and object of the invention, a rotary controller has at least two operating elements, which are arranged at a spacing from one another in a direction of extent of an axis of rotation of the rotary controller. In other words, the rotary controller has at least two operating elements stacked one above the other, which are spaced from one another with a spacing of greater than zero. The rotary controller therefore offers an increased number of adjustment options (i.e., ability to control more adjustable parameters).

According to an embodiment, haptic elements having different haptic properties are associated with the at least two operating elements. The haptic elements can be, for example, a ribbing or a recessed grip. It is therefore possible to switch from one operating element to the other operating element by touch alone, without visual contact. The haptic elements of the at least two operating elements haptic elements can also have identical haptic properties but separately located with regard to the different operating elements.

According to a further embodiment, the at least two operating elements, which are arranged with a spacing, are spaced by a spacer element which is arranged between the two operating elements. A predetermined spacing can therefore be ensured.

According to a further embodiment in which the at least two spacer elements are provided, haptic elements having different haptic properties are respectively associated with the at least two spacer elements. It is therefore possible to identify different spacer elements by touch alone, without visual contact. The haptic elements of the at least two spacer elements can alternatively have identical haptic properties.

According to a further embodiment, the haptic elements of the operating elements and the haptic elements of the spacer elements have uniquely different haptic properties. It is therefore possible to differentiate between operating elements and spacer elements by touch alone, without visual contact. The haptic elements of the operating elements and the spacer elements can alternatively have identical haptic properties.

According to a further embodiment, a contact-sensitive (i.e., proximity-sensitive) sensor element is associated with each of the operating elements in each case to detect a rotational movement of an incident object about the axis of rotation. The stationary sensor elements can be designed, for example, as capacitive sensor elements. An operating element is not moved, but contact and a subsequent movement of the incident object, e.g., a finger of a user, over the respective operating element is detected. Movable components are therefore not required. The movement may typically be along a circumferential direction of an operating element with an annular, cylindrical form. In an embodiment, a sensor element having a plurality of sensor surfaces can be provided, wherein each of the sensor surfaces is associated with one of the operating elements.

According to a further embodiment, components on a printed circuit board receive electrical signals from the sensor elements. The hardware and/or software components are configured to (A) determine one of the functions of the motor vehicle which is associated with the respective operating element, and (B) alter a parameter value assigned to the determined function according to the detected rotational movement at the respective operating element.

According to a further embodiment, the at least two operating elements are rotatable about the axis of rotation. The operating elements are therefore movably mounted. Haptic feedback is provided as a result of adjusting the movable operating elements.

According to a further embodiment, a stationary sensor element is associated with the operating elements in each case to detect a rotational movement about the axis of rotation. The sensor elements can be arranged in the interior of the rotary controller. This enables a simple and compact construction of the rotary controller.

According to a further embodiment, the operating elements are each designed to detect contact by an external object. To this end, the operating elements can have buttons, such as capacitive buttons. The selection of one of the operating elements can therefore be detected.

According to a further embodiment, upon detecting contact with one of the operating elements, the rotary controller is designed to determine a function associated with the respective operating element. The functions can be functions of an infotainment system of a motor vehicle. In motor vehicles, especially automobiles, an infotainment system refers to the combination of car radio, navigation system, hands-free equipment, driver assistance systems, air-conditioning system, and further functions in a central operating unit. For example, the volume, radio station setting, or blower level can be altered by means of the rotary controller of the infotainment system.

According to a further embodiment, the rotary controller is designed to alter a value associated with the particular function. Operating parameters of an infotainment system of a motor vehicle, such as the volume, radio station setting, or blower level, for example, can therefore be altered.

The invention furthermore relates to an infotainment system having such a rotary controller and a motor vehicle having such an infotainment system.

DETAILED DESCRIPTION OF PREFERRED EMBODIMENTS

Figure 1:
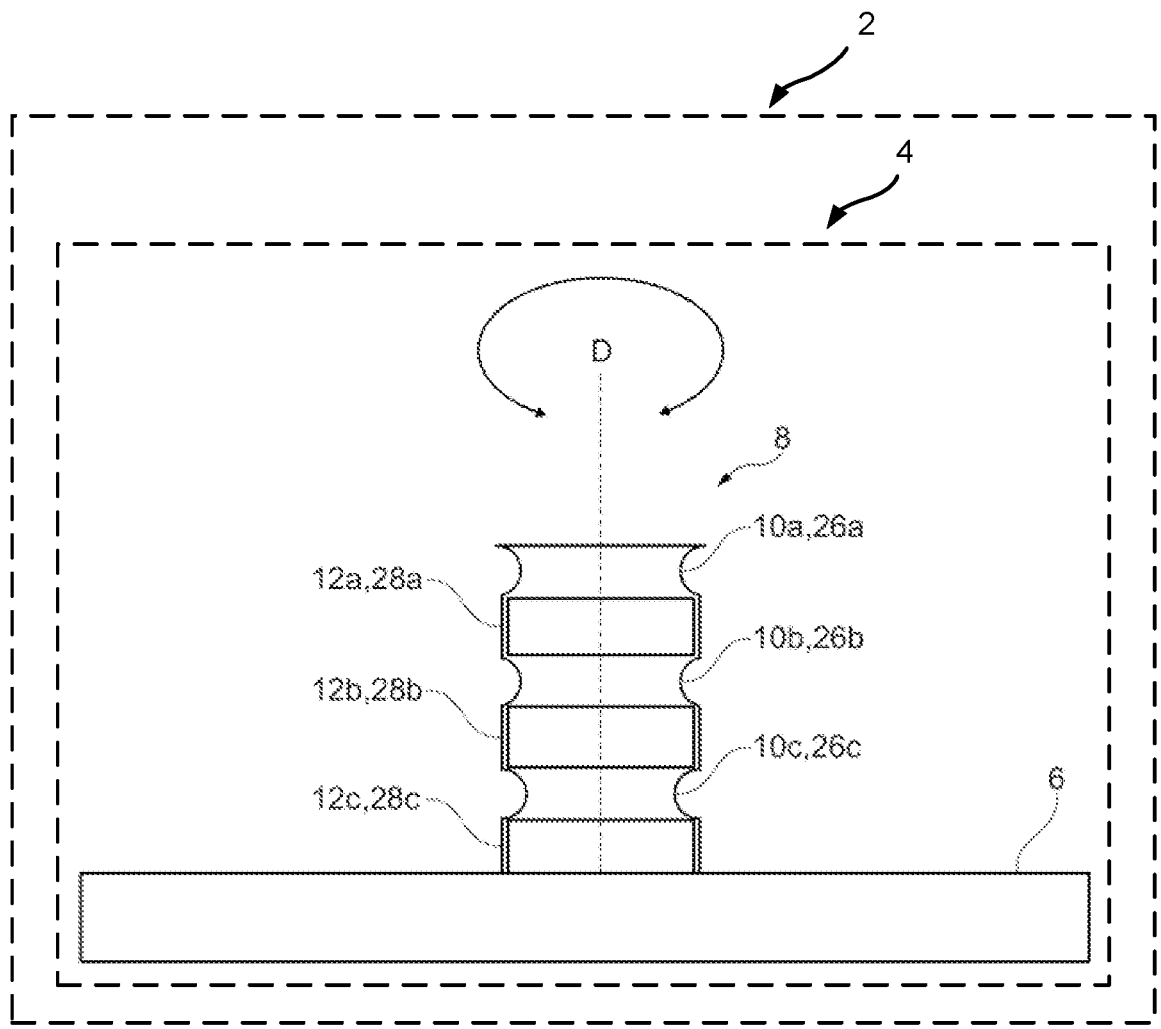
FIG. 1 shows a rotary controller according to an exemplary embodiment in a schematic illustration.

Referring to FIG. 1, a rotary controller 8 is illustrated which is inserted into a panel 6. The rotary controller 8 can be designed to operate an infotainment system 4 of a motor vehicle 2, such as an automobile, for example.

The infotainment system 4 combines functions of a car radio, a navigation system, hands-free equipment, driver assistance systems, an air-conditioning system and/or further functions in a central operating unit.

In the present exemplary embodiment, the rotary controller 8 has three operating elements 10a, 10b, 10c, which are arranged at a predetermined spacing from one another in the direction of extent of an axis of rotation D of the rotary controller 8. In this case, each of the operating elements enables operation via a rotational movement about the axis of rotation D. The movement can be of a user's finger sliding over fixed operating elements or of a rotation of the operating elements themselves, as will be explained in more detail below.

A spacer element 12a, 12b, 12c is arranged between two adjacent operating elements 10a, 10b and between the operating element 10c and the panel 6 in each case, so that the operating elements 10a, 10b, 10c are each arranged at a predetermined spacing from one another along the direction of axis of rotation D.

In the present exemplary embodiment, both the operating elements 10a, 10b, 10c and the spacer elements 12a, 12b, 12c each have a generally annular form. Furthermore, in the present exemplary embodiment, both the operating elements 10a, 10b, 10c and the spacer elements 12a, 12b, 12c have the same extent in the radial direction. Moreover, in the present exemplary embodiment, the operating elements 10a, 10b, 10c have haptic elements (e.g., on gripping surfaces) 26a, 26b, 26c on the outside, for example with ribbing, corrugations, indentations, or a recessed grip.

In contrast, in the present exemplary embodiment, the spacer elements 12a, 12b, 12c have haptic elements (e.g., surfaces) 28a, 28b, 28c which differ from the haptic elements 26a, 26b, 26c of the operating elements 10a, 10b, 10c. It is therefore possible for a user to identify operating elements 10a, 10b, 10c, and to differentiate them from the spacer elements 12a, 12b, 12c, by touch alone. Alternatively, the haptic elements 26a, 26b, 26c of the operating elements 10a, 10b, 10c and the haptic elements 28a, 28b, 28c of the spacer elements 12a, 12b, 12c can each differ from one another. Differentiation is then possible based on the respective position of the operating elements 10a, 10b, 10c and the spacer elements 12a, 12b, 12c.

The haptic elements 28a, 28b, 28c of the spacer elements 12a, 12b, 12c can furthermore each be different from one another. Alternatively, the haptic elements 28a, 28b, 28c of the operating elements 10a, 10b, 10c can also be the same. Differentiation is then possible based on the respective position of the operating elements 10a, 10b, 10c.

Finally, the haptic elements 26a, 26b, 26c of the operating elements 10a, 10b, 10c can also differ from one another. It is therefore possible to differentiate between the operating elements 10a, 10b, 10c by touch alone. Alternatively, the haptic elements 26a, 26b, 26c of the operating elements 10a, 10b, 10c can also be the same. Differentiation is then possible based on the respective position of the operating elements 10a, 10b, 10c.

As a result of contact of a user's fingers with, and a subsequent rotational movement about the axis of rotation D along the respective circumferential direction while remaining in contact with, the operating elements 10a, 10b, 10c, a function of the infotainment system 4 of the motor vehicle 2 can be activated and a value of the respective function can be altered. Operating parameters of the infotainment system 4 of the motor vehicle 2, such as the volume, radio station setting, or blower level, for example, can therefore be altered.

To detect contact and a subsequent rotational movement, a capacitive sensor element can be associated with each of the operating elements 10a, 10b, 10c. In other words, by means of the capacitive sensor elements, contact and a subsequent rotational movement about the axis of rotation D along the respective circumferential direction of the operating elements 10a, 10b, 10c can be detected without a corresponding mechanical rotational movement of one of the operating elements 10a, 10b, 10c taking place.

The respective sensor element of each respective operating elements 10a, 10b, 10c detects a user's finger or hand closely positioned or in contact with it, and detects if a hand moves over a surface. Thus, they detect a rotational movement about the axis of rotation D without a mechanical rotational movement taking place. An active feedback system can be provided, which has actuators, such as electromagnets or piezoelectric actuators, for example, which provide additional haptic feedback during the rotational movement of the user on the operating elements.

Alternatively, the operating elements 10a, 10b, 10c can be non-rotatable with respect to one another while being rotatable together as a whole, wherein the sensor element detects the rotated position of the operating elements 10a, 10b, 10c. In other words, the operating elements 10a, 10b, 10c and possibly the spacer elements 12a, 12b, 12c form a knob component, which rotates as a whole about the axis of rotation D, wherein the rotation is detected by electrical contacts or by a sensor system on a printed circuit board 24 (see FIG. 2). A haptic feedback can then be provided by a detent cam system, for example.

Alternatively, it can also be provided that the operating elements 10a, 10b, 10c are each mounted to be rotatable about the axis of rotation D independently. A subsequent rotational movement of the operating elements 10a, 10b, 10c about the axis of rotation D along the respective circumferential direction is detected by stationary capacitive sensor elements 14a, 14b, 14c (see FIG. 2). Capacitive sensor elements 14a, 14b, 14c may be circumferential. In some embodiments, a sensor element having a plurality of sensor surfaces can also be provided, wherein each of the sensor surfaces is associated with one of the operating elements 10a, 10b, 10c.

Figure 2:
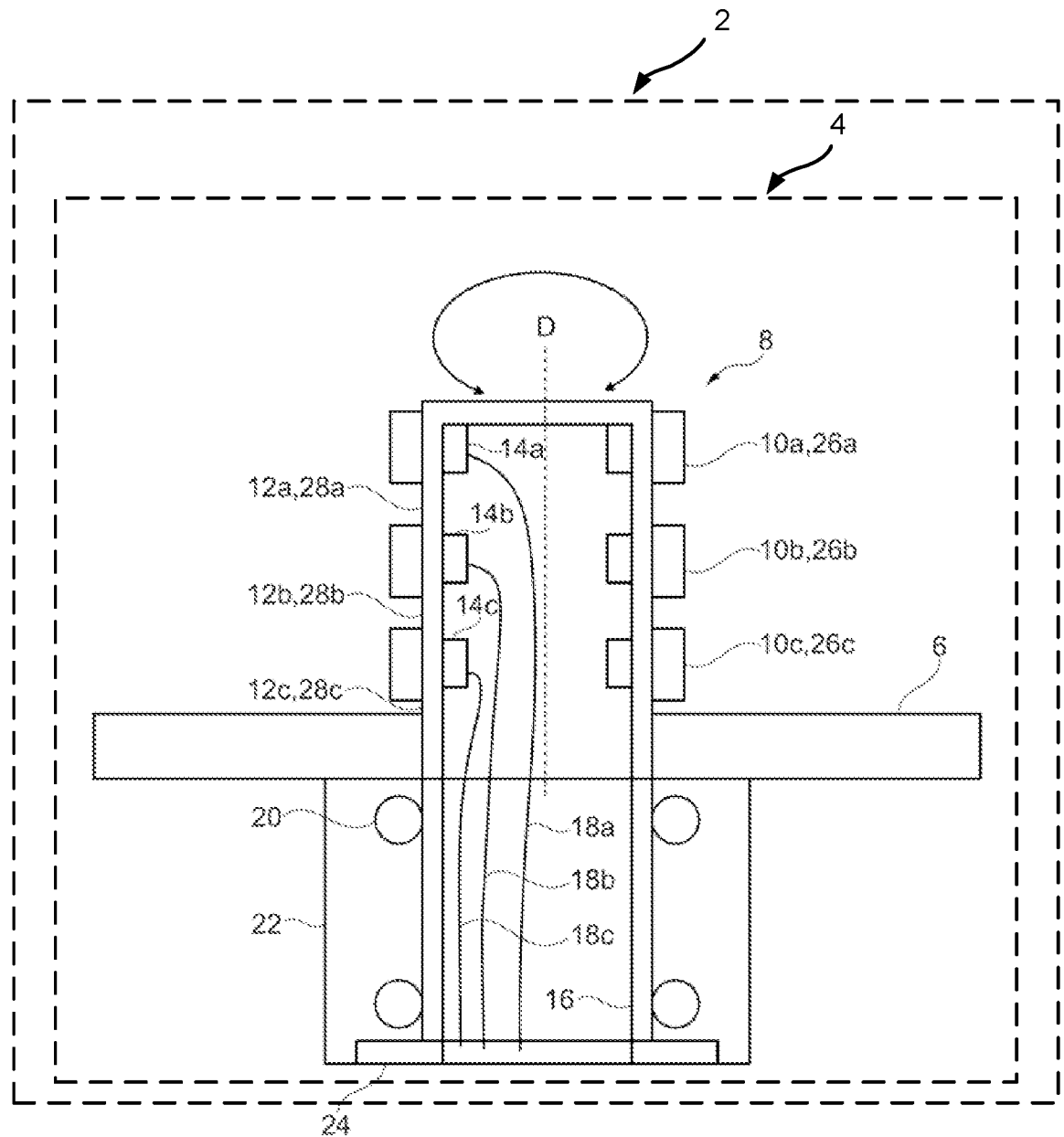
FIG. 2 is a schematic view of the rotary controller of FIG. 1 showing greater detail.

An alternative embodiment of the rotary controller 8 will, in particular, now be further explained with additional reference to FIG. 2. The rotary controller 8 has a first portion, which is located above the panel 6, and a second portion, which is located below the panel 6.

In the first portion, the sensor elements 14a, 14b, 14c are received in a receptacle 16 in the interior of the rotary controller 8, which receptacle has a tubular design in the present exemplary embodiment. A portion of receptacle 16 receiving sensor elements 14a, 14b, 14c is stationary.

A rotational movement of a user's fingers with or without a rotational movement of the respective operating elements 10a, 10b, 10c about the axis of rotation D can be detected by the sensor elements 14a, 14b, 14c.

Extending from the sensor elements 14a, 14b, 14c are signal lines 18a, 18b, 18c which transmit electrical measured values indicative of a rotational movement about the axis of rotation D to the printed circuit board 24, which is received in a housing 22 below the panel 6, e.g., in the second portion. A bearing 20 for the rotatable mounting of the operating elements 10a, 10b, 10c, which are rotatable in the present exemplary embodiment, is furthermore provided in the housing 22.

In the present exemplary embodiment, the printed circuit board 24 has hardware and/or software components, which, upon detecting contact with one of the operating elements 10, 10b, 10c, are designed to determine a function associated with the respective operating element 10a, 10b, 10c. To this end, the operating element 10a, 10b, 10c can itself have capacitive sensor elements to detect this contact. Alternatively, the hardware and/or software components of the printed circuit board 24 can be designed to regard a commencing rotational movement about the axis of rotation D as contact. For example, a minimum rotational movement may be required to bring about a change in value. Rotational movements below the minimum rotational movement are then regarded as contact.

In the present exemplary embodiment, the hardware and/or software components of the printed circuit board 24 are furthermore designed to alter a value assigned to the particular function upon a detected rotational movement of the respective operating element 10a, 10b, 10c about the axis of rotation D. The result can then be fed into a communication bus (e.g., a CAN bus) of the motor vehicle 2, for example. In other words, the hardware and/or software components of the printed circuit board 24 provide a CAN bus compatible output, for example. Alternatively, the output can be LIN or Ethernet compatible.

In the present exemplary embodiment, the hardware and/or software components of the printed circuit board 24 can furthermore be designed so that an association of a plurality of functions can be freely associated with those of the respective operating element 10a, 10b, 10c. In other words, it can be established, for example, that the audio volume can be altered by means of the top operating element 10a, a radio station setting can be altered by means of the central operating element 10b, and a blower level can be altered by means of the bottom operating element 10c.

Therefore, a function of the infotainment system 4 can be selected and a value associated with the selected function can be altered. Operating parameters of the infotainment system 4 of the motor vehicle 2, such as the volume, station setting, or blower level, for example, can therefore be altered.

The rotary controller 8 therefore offers an increased number of adjustment options.

What is claimed is:

1. Apparatus for controlling respective functions in a motor vehicle, comprising:
   a plurality of operating elements arranged cylindrically along an axis of rotation of the apparatus, wherein adjacent operating elements are separated according to a predetermined spacing;
   a plurality of contact-sensitive sensor elements, each sensor element associated with a respective operating element to detect a rotational movement about the axis of rotation when a user manually contacts the respective operating element; and
   components on a printed circuit board receiving electrical signals from the sensor elements and configured to (A) determine one of the functions of the motor vehicle which is associated with the respective operating element, and (B) alter a parameter value assigned to the determined function according to the detected rotational movement at the respective operating element.

2. The apparatus of claim 1, wherein the operating elements include respective haptic features having respective haptic properties perceptible by touch of a user to differentiate between the operating elements.

3. The apparatus of claim 2, wherein the haptic features include ribbing, indentations, or corrugations.

4. The apparatus of claim 1, further comprising:
   a plurality of spacer elements with a respective spacer element disposed between pairs of adjacent operating elements and providing the predetermined spacing.

5. The apparatus of claim 4, wherein the spacer elements include respective haptic features having respective haptic properties perceptible by touch of a user to differentiate between the spacer elements and the operating elements.

6. The apparatus of claim 5, wherein the operating elements include respective haptic features having respective haptic properties perceptible by touch of a user to differentiate between the operating elements, and wherein the haptic features of the operating elements are uniquely different from the haptic features of the spacer elements.

7. The apparatus of claim 6, wherein the haptic features include ribbing, indentations, or corrugations.

8. The apparatus of claim 1, wherein the operating elements are mounted for rotation about the axis of rotation.

9. The apparatus of claim 8, wherein the sensor elements are stationary and extend circumferentially around the apparatus, wherein each sensor element detects a rotational movement about the axis of rotation of the respective operating element.

10. The apparatus of claim 1, wherein the operating elements and the sensor elements are stationary, wherein the sensor elements extend circumferentially around the apparatus, and wherein each sensor element is configured to detect a rotational movement about the axis of rotation provided by the manual contact of the user.

11. The apparatus of claim 1, wherein the respective functions are comprised of vehicle infotainment functions including an audio volume.

12. The apparatus of claim 1, further comprising:
   a bezel disposed between the components on the printed circuit board and the operating elements; and
   a receptacle passing through the bezel onto which the operating elements and sensor elements are mounted.

13. An infotainment system for a vehicle comprising:
   a rotary controller comprising a plurality of operating elements and a plurality of contact-sensitive sensor elements, wherein the operating elements are arranged cylindrically along an axis of rotation of the rotary controller, wherein adjacent operating elements are separated according to a predetermined spacing, wherein each sensor element is associated with a respective operating element to detect a rotational movement about the axis of rotation when a user manually contacts the respective operating element;
   a printed circuit board comprising components which receive electrical signals from the sensor elements; and
   a bezel disposed between the printed circuit board and the operating elements;
   wherein each operating component is associated with a respective controllable function of the infotainment system;
   wherein the components are configured to (A) determine a respective one of the controllable functions which is associated with a respective operating element from which electrical signals are received, and (B) alter a parameter value assigned to the determined controllable function according to the detected rotational movement at the respective operating element.

14. The infotainment system of claim 13, wherein the sensor elements are stationary and extend circumferentially around the rotary controller, wherein each sensor element detects a rotational movement about the axis of rotation of the respective operating element.

15. The infotainment system of claim 14, further comprising:
a plurality of spacer elements included in the rotary controller, wherein a respective spacer element is disposed between pairs of adjacent operating elements to provide the predetermined spacing.

16. The infotainment system of claim 15, wherein the operating elements include respective haptic features having respective haptic properties perceptible by touch of a user to differentiate between the operating elements, wherein the spacer elements include respective haptic features having respective haptic properties perceptible by touch of a user to differentiate between the spacer elements and the operating elements, and wherein the haptic features of the operating elements are uniquely different from the haptic features of the spacer elements.

17. The infotainment system of claim 16, wherein the haptic features include ribbing, indentations, or corrugations.

18. The infotainment system of claim 13, further comprising:
a receptacle passing through the bezel onto which the operating elements and sensor elements are mounted.

19. The infotainment system of claim 13, wherein the respective controllable function includes an audio volume.

* * * * *